(12) United States Patent
Jin et al.

(10) Patent No.: US 11,799,389 B2
(45) Date of Patent: Oct. 24, 2023

(54) POWER MODULE

(71) Applicant: Delta Electronics, Inc., Taoyuan (TW)

(72) Inventors: Da Jin, Taoyuan (TW); Xiaodong Chen, Taoyuan (TW); Shengli Lu, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 322 days.

(21) Appl. No.: 17/354,807

(22) Filed: Jun. 22, 2021

(65) Prior Publication Data

US 2022/0006394 A1  Jan. 6, 2022

(30) Foreign Application Priority Data

Jul. 1, 2020  (CN) .......................... 202010625724.0

(51) Int. Cl.
| | |
|---|---|
| *H02M 3/24* | (2006.01) |
| *H02M 7/00* | (2006.01) |
| *H05K 1/18* | (2006.01) |
| *H01F 27/28* | (2006.01) |
| *H01F 27/24* | (2006.01) |

(52) U.S. Cl.
CPC ............ *H02M 7/003* (2013.01); *H01F 27/24* (2013.01); *H01F 27/2804* (2013.01); *H02M 3/24* (2013.01); *H05K 1/181* (2013.01)

(58) Field of Classification Search
CPC ......... H02M 7/003; H02M 3/24; H01F 27/24; H01F 27/2804; H05K 1/181
See application file for complete search history.

(56) References Cited

U.S. PATENT DOCUMENTS

| | | |
|---|---|---|
| 10,791,645 B1 | 9/2020 | Vinciarelli et al. |
| 2020/0113059 A1 | 4/2020 | Xiong et al. |
| 2022/0051842 A1* | 2/2022 | Chang ............... H02M 3/33573 |
| 2022/0255456 A1* | 8/2022 | Jin .................... H02M 3/33592 |

FOREIGN PATENT DOCUMENTS

| | | |
|---|---|---|
| CN | 100452630 C | 1/2009 |
| CN | 103081325 B | 8/2016 |
| CN | 112104202 A | 12/2020 |

* cited by examiner

*Primary Examiner* — Adolf D Berhane
(74) *Attorney, Agent, or Firm* — KIRTON McCONKIE; Evan R. Witt

(57) ABSTRACT

A power module includes a printed circuit board, a magnetic element, a secondary side switching circuit and at least two groups of external terminals. The magnetic element is disposed on the printed circuit board. The magnetic element includes at least one primary winding and plural secondary windings. The secondary side switching circuit includes a plurality of secondary switching units. Each secondary switching unit includes a plurality of switches connected in parallel. The switches of each secondary switching unit are evenly distributed on a first surface and a second surface of the printed circuit board. The switches of the secondary switching unit on the first surface and the second surface of the printed circuit board are at least partially overlapped with each other. The at least two groups of external terminals are disposed on the second surface of the printed circuit board, and electrically connected with the secondary side switching circuit.

19 Claims, 10 Drawing Sheets

POWER MODULE

CROSS-REFERENCE TO RELATED APPLICATION

This application claims priority to China Patent Application No. 202010625724.0, filed on Jul. 1, 2020, the entire contents of which are incorporated herein by reference for all purposes.

FIELD OF THE INVENTION

The present disclosure relates to a power module, and more particularly to a power module for a large current application to enhance the power conversion efficiency, reduce the size and increase the power density.

BACKGROUND OF THE INVENTION

Generally, a power module is equipped with a magnetic element such as a transformer or an inductor. The magnetic element usually includes a U-shaped magnetic core. The U-shaped magnetic core has two winding legs. Taking a transformer as an example, each winding leg of the U-shaped magnetic core is wound by one primary winding and one secondary winding. For complying with the high power output requirements, the respective primary winding or the respective secondary winding of the two winding legs are connected with each other in parallel or in series.

However, since the magnetic element with the U-shaped magnetic core has a large size (e.g., thickness and/or width), the volume of the power module with the magnetic element is large and the power density of the power module will decrease.

In addition, in order to increase the output efficiency of the power module, the power module is usually designed to provide large current. However, in the conventional power module, the position arrangement of the associated electronic components on the printed circuit board will result in the nonuniformity distribution of the large current, and thereby the power conversion efficiency of the power module is unable to be effectively increased.

SUMMARY OF THE INVENTION

An object of the present disclosure provides a power module to address the issues encountered by the prior arts that the large current is not evenly distributed in the printed circuit board and the power conversion efficiency of the power module is unable to be effectively increased.

Another object of the present disclosure provides a power module for a large current application. The package structure of the power module is specially designed. Consequently, the power conversion efficiency is enhanced, the size is reduced, and the power density is increased.

In accordance with an aspect of the present disclosure, a power module is provided. The power module includes a printed circuit board, a magnetic element, a secondary side switching circuit and at least two groups of external terminals. The printed circuit board has a first surface and a second surface. The magnetic element is disposed on the printed circuit board. The magnetic element includes at least one primary winding and a plurality of secondary windings. The secondary side switching circuit includes a plurality of secondary switching units. Each of the plurality of secondary switching units is electrically connected with the corresponding secondary winding of the plurality of secondary windings. Each secondary switching unit includes a plurality of switches connected in parallel. The plurality of switches are evenly distributed on the first surface and the second surface of the printed circuit board. One part of the plurality of switches of each secondary switching unit are disposed on the first surface, and another part of the plurality of switches of each secondary switching unit are disposed on the second surface, and in each secondary switching unit, the projection of the switches on the first surface of the printed circuit board is at least partially overlapped with the projection of the switches on the second surface of the printed circuit board. The at least two groups of external terminals are disposed on the second surface of the printed circuit board, and electrically connected with the plurality of secondary switching units. The external terminals are located at one side of the secondary side switching circuit. The secondary side switching circuit is arranged between the magnetic element and the external terminals.

In accordance with another aspect of the present disclosure, a power module is provided. The power module includes a printed circuit board, a magnetic element and a plurality of switching units. The printed circuit board has a first surface and a second surface. The magnetic element is disposed on the printed circuit board. The magnetic element includes at least two winding legs, at least two outer legs, a first connection part, a second connection part and at least two winding units. The first connection part and the second connection part are connected with the at least two winding legs and the at least two outer legs. The at least two winding legs are arranged between the at least two outer legs. The at least two winding units are wound on the at least two winding legs respectively. The directions of AC magnetic fluxes generated by the corresponding windings wound on any two adjacent winding legs are opposite. The plurality of switching units are disposed on the printed circuit board, and electrically connected with the at least two winding units. A reference thickness is defined as the largest one of the thickness of the plurality of switching unit, and at least one of the first connection part and the second connection part has a thickness within a range of 50%~150% thickness of the reference thickness.

From the above descriptions, the present disclosure provides the power module. Each of the secondary switching units of the secondary side switching circuit of the power module includes even-numbered switches connected in parallel. In addition, the even-numbered switches of each secondary switching unit are evenly distributed on the first surface and the second surface of the printed circuit board. Consequently, after the current flows through each of the second secondary windings, the current can evenly flow through different layers of the printed circuit board and evenly flow through the two switches of the corresponding secondary switching units. Since the power loss in the current path is reduced, the power conversion efficiency of the power module is enhanced.

The above contents of the present disclosure will become more readily apparent to those ordinarily skilled in the art after reviewing the following detailed description and accompanying drawings, in which:

DETAILED DESCRIPTION

The present disclosure will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
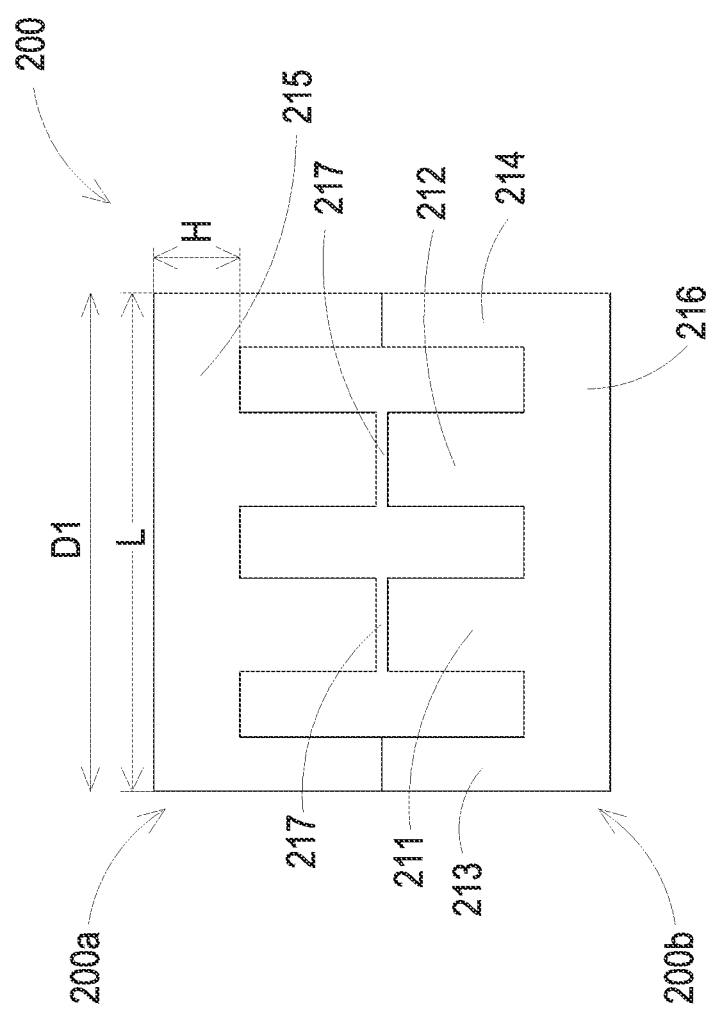
FIG. 1 is a schematic view illustrating a magnetic core of a magnetic element for a power module according to an embodiment of the present disclosure.
Figure 2:
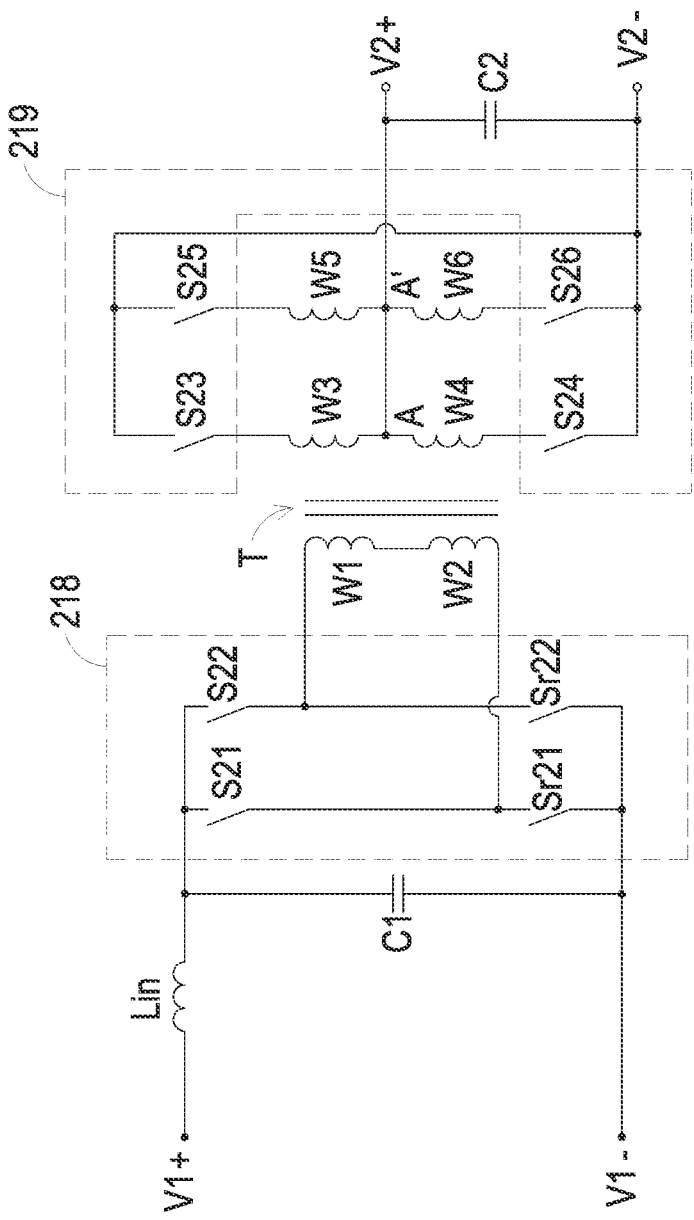
FIG. 2 is a schematic circuit diagram illustrating the exemplary power module having the magnetic core as shown in FIG. 1 according to the embodiment of the present disclosure.
Figure 3:
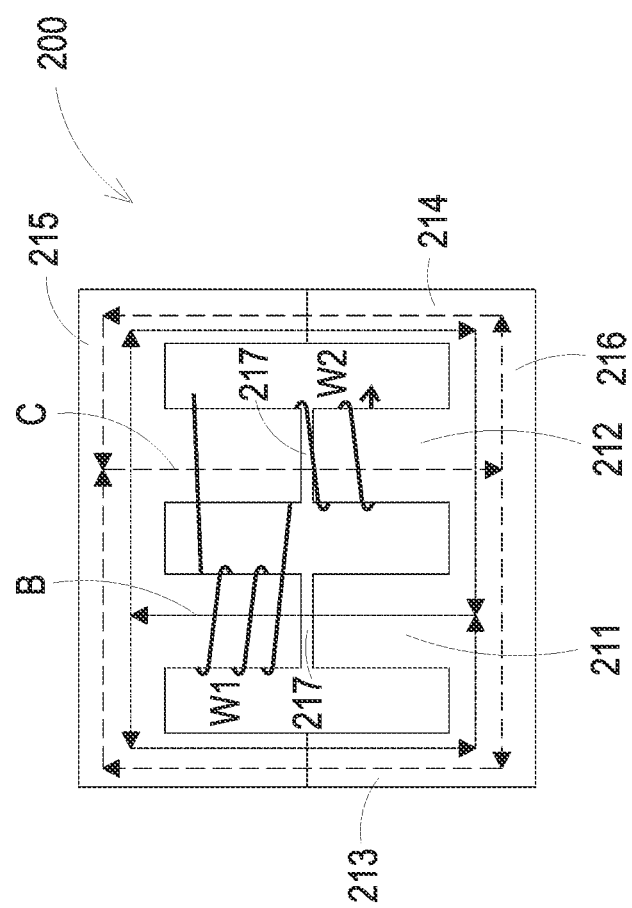
FIG. 3 is a schematic view illustrating the magnetic element of the power module as shown in FIG. 2, in which two primary windings are wound around the magnetic core as shown in FIG. 1.
Figure 4:
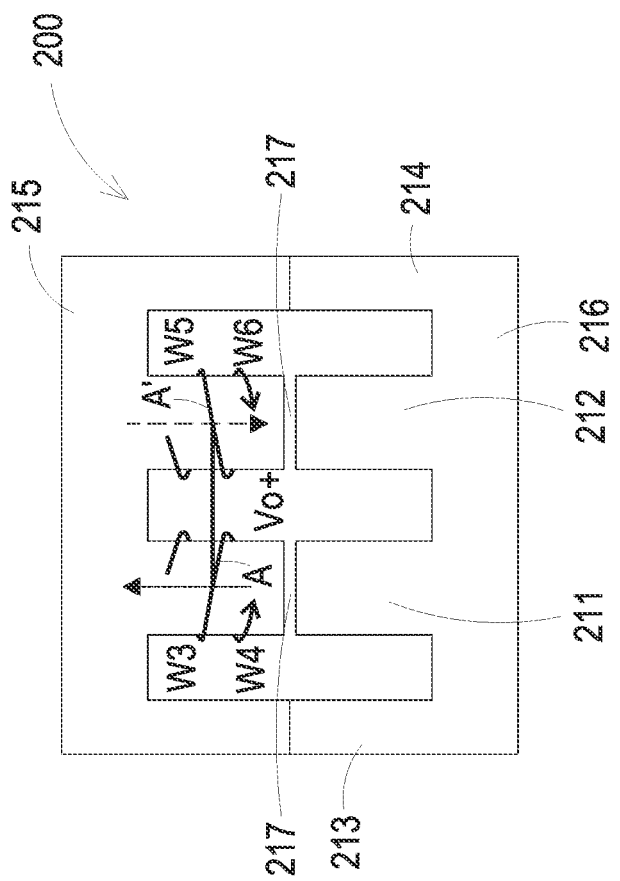
FIG. 4 is a schematic view illustrating the magnetic element of the power module as shown in FIG. 2, in which four secondary windings are wound around the magnetic core as shown in FIG. 1.

FIG. 1 is a schematic view illustrating a magnetic core of a magnetic element for a power module according to an embodiment of the present disclosure. FIG. 2 is a schematic circuit diagram illustrating the exemplary power module having the magnetic core as shown in FIG. 1 according to the embodiment of the present disclosure. FIG. 3 is a schematic view illustrating the magnetic element of the power module as shown in FIG. 2, in which two primary windings are wound around the magnetic core as shown in FIG. 1. FIG. 4 is a schematic view illustrating the magnetic element of the power module as shown in FIG. 2, in which four secondary windings are wound around the magnetic core as shown in FIG. 1.

Please refer to FIGS. 1, 2, 3 and 4. The present disclosure provides a power module, such as power module 21 as shown in FIG. 2. The power module 21 includes a magnetic element 20 such as a transformer. The magnetic element 20 includes a magnetic core 200 and a plurality of windings (see FIGS. 3 and 4). The plurality of windings are wound around the magnetic core 200. The magnetic core 200 includes a first winding leg 211, a second winding leg 212, a first outer leg 213, a second outer leg 214, a first connection part 215 and a second connection part 216. The first connection part 215 and the second connection part 216 are connected with the first winding leg 211, the second winding leg 212, the first outer leg 213 and the second outer leg 214.

The first outer leg 213 and the second outer leg 214 are arranged between the first connection part 215 and the second connection part 216. Further, the first outer leg 213 and the second outer leg 214 are arranged on both sides of the first connection part 215 and the second connection part 216, respectively. The first winding leg 211 and the second winding leg 212 are arranged between the first outer leg 213 and the second outer leg 214. Moreover, the first winding leg 211 and the second winding leg 212 are separated from the first outer leg 213 and the second outer leg 214 at a predetermined distance. As shown in FIG. 1, each of the first connection part 215 and the second connection part 216 has a length L, a width WD1 (see FIG. 5) and a height H. The first outer leg 213, the first winding leg 211, the second winding leg 212 and the second outer leg 214 are sequentially arranged along a linear direction D1. The linear direction D1 is in parallel with the length direction of the magnetic core 200. In the following embodiment, the height of the first connection part 215 and the height of the second connection part 216 are identical. It is noted that the height of the first connection part 215 and the height of the second connection part 216 may be different according to various requirements.

Moreover, the horizontal cross section area of the first winding leg 211 and the horizontal cross section area of the second winding leg 212 are substantially equal, and the horizontal cross section area of the first outer leg 213 and the horizontal cross section area of the second outer leg 214 are substantially equal. Here, the term "substantially equal" does not mean absolute equality. Due to the existence of tolerances in the manufacturing process, the difference between the two and the difference between either of them is less than 10%, which is deemed to be substantially equal. The following terms "substantially equal" are all defined in this way.

In an embodiment, each of the first winding leg 211 and the second winding leg 212 may include a first air gap 217, and the first outer leg 213 and the second outer leg 214 may have no air gaps. In some other embodiments, each of the first winding leg 211 and the second winding leg 212 may include a first air gap 217, and each of the first outer leg 213 and the second outer leg 214 may include a second air gap (not shown). The size of the second air gap in the outer leg is not restricted. Moreover, in case that the power module 21 including the magnetic element 20 does not require the magnetized current, the first winding leg 211 and the second winding leg 212 are not equipped with the air gaps.

In some embodiments, the magnetic core 200 includes a first magnetic core unit 200a and a magnetic second core unit 200b independent from each other. The first magnetic core unit 200a includes the first connection part 215. The second magnetic core unit 200b includes the second connection part 216. The first winding leg 211, the second winding leg 212, the first outer leg 213 and the second outer leg 214 are defined by the first magnetic core unit 200a and the second magnetic core unit 200b collaboratively. In some other embodiments, the first winding leg 211, the second winding leg 212, the first outer leg 213 and the second outer leg 214 are defined by one of the first magnetic core unit 200a and the second magnetic core unit 200b, and the other of the first magnetic core unit 200a and the second magnetic core unit 200b may be an I-shaped core.

Please refer to FIG. 2 again. The power module 21 includes a first end, a second end, an inductor Lin, a first capacitor C1, a primary side switching circuit 218, a transformer T, a secondary side switching circuit 219 and a second capacitor C2.

Moreover, one of the first end and the second end may be an input terminal, and the other of the first end and the second end may be an output terminal. In this embodiment, the first end is used as the input terminal, and the second end is used as an output terminal. The first end includes a first positive terminal V1+ and a first negative terminal V1−. The second end includes a second positive terminal V2+ and a second negative terminal V2−. The inductor Lin is electrically connected with the first positive terminal V1+ in series. The first capacitor C1 is electrically connected between the inductor Lin and the first negative terminal V1−.

The primary side switching circuit 218 is electrically connected with the first capacitor C1 in parallel. In an embodiment, the primary side switching circuit 218 includes four primary switching units S21, S22, Sr21 and Sr22. The four primary switching units S21, S22, Sr21 and Sr22 are collaboratively formed as a full-bridge circuit. The primary switching unit S21 and the primary switching unit Sr21 are serially connected with each other and collaboratively formed as a first bridge arm of the full-bridge circuit. The primary switching unit S22 and the primary switching unit Sr22 are serially connected with each other and collaboratively formed as a second bridge arm of the full-bridge circuit.

The transformer T includes the magnetic core 200 (not shown in FIG. 2), a first primary winding W1, a second primary winding W2, a first group of secondary windings (W3, W4) and a second group of secondary windings (W5, W6). The first primary winding W1 and the second primary winding W2 are serially connected between a midpoint of the first bridge arm and a midpoint of the second bridge arm. The turn number of the first primary winding W1 is equal to that of the second primary winding W2. For example, the turn number is 3. Preferably, but not limited to, the first primary winding W1 and the second primary winding W2 are planar PCB windings. The first group of secondary windings (W3, W4) and the second group of secondary windings (W5, W6) are magnetically coupled with the first primary winding W1 and the second primary winding W2 through the magnetic core 200. The turn number of the first group of secondary windings (W3, W4) is equal to that of the second group of secondary windings (W5, W6). The first group of secondary windings (W3, W4) includes a first secondary winding W3 and a second secondary winding W4 with a center-tapped structure. The second group of secondary windings (W5, W6) includes a third secondary winding W5 and a fourth secondary winding W6 with a center-tapped structure. The second group of secondary windings (W5, W6) are parallel to the first group of secondary windings (W3, W4).

The secondary side switching circuit 219 is electrically connected with the first group of secondary windings (W3, W4), the second group of secondary windings (W5, W6), the second positive terminal V2+ and the second negative terminal V2−. The secondary side switching circuit 219 includes four secondary switching units S23, S24, S25 and S26. The secondary switching unit S23 is electrically connected with the first secondary winding W3 in series. The secondary switching unit S24 is electrically connected with the second secondary winding W4 in series. The secondary switching unit S25 is electrically connected with the third secondary winding W5 in series. The secondary switching unit S26 is electrically connected with the fourth secondary winding W6 in series.

The second capacitor C2 is electrically connected between the second positive terminal V2+ and the second negative terminal V2−. In some embodiments, the second group of secondary windings (W5, W6) and the first group of secondary windings (W3, W4) are connected in parallel, and the secondary side switching circuit 219 is electrically connected to the first group of secondary windings (W3, W4), the second group of secondary windings (W5, W6), the second positive terminal V2+ and the second negative terminal V2−. Consequently, the power module 21 substantially has two parallel loops at the secondary side of the transformer T.

In some embodiments, in case that the power module 21 is applied to the large current applications, it is necessary to increase the capability of the switching unit to withstand current. For achieving this purpose, each of the primary switching units S21, S22, Sr21 and Sr22 and/or each of the secondary switching units S23, S24, S25 and S26 includes even-numbered and parallel-connected switches. For example, in an embodiment, each of the secondary switching units S23, S24, S25 and S26 includes two parallel-connected switches.

Please refer to FIG. 3. In order to describe the winding methods of the first primary winding W1 and the second primary winding W2, the first group of secondary windings (W3, W4) and the second group of secondary windings (W5, W6) are not shown in FIG. 3. As shown in FIG. 3, the first primary winding W1 is wound on the first winding leg 211, and the second primary winding W2 is wound on the second winding leg 212. The voltage across two terminals of the first primary winding W1 and the voltage across two terminals of the second primary winding W2 are AC voltages. The AC magnetic flux generated by the first primary winding W1 wound on the first winding leg 211 (e.g., the AC magnetic flux indicated by the dotted line B) has opposite directions to the AC magnetic flux generated by the second primary winding W2 wound on the second winding leg 212 (e.g., the AC magnetic flux indicated by the dotted line C).

As mentioned above, the AC magnetic flux generated by the first primary winding W1 wound on the first winding leg 211 and the AC magnetic flux generated by the second primary winding W2 wound on the second winding leg 212 are in opposite directions. In some embodiments, the winding direction of the first primary winding W1 wound on the first winding leg 211 is opposite to the winding direction of the second primary winding W2 wound on the second winding leg 212. For example, as shown in FIG. 3, the first primary winding W1 is wound on the first winding leg 211 in a counterclockwise direction, and the second primary winding W2 is wound on the second winding leg 212 in a clockwise direction. The winding directions of the first primary winding W1 and the second primary winding W2 are not restricted as long as the AC magnetic flux generated by the first primary winding W1 wound on the first winding leg 211 and the AC magnetic flux generated by the second primary winding W2 wound on the second winding leg 212 are opposite. For example, in some embodiments, in case that the phase difference between the voltage across two terminals of the first primary winding W1 and the voltage across two terminals of the second primary winding W2 is 180 degrees, the winding direction of the first primary winding W1 wound on the first winding leg 211 and the winding direction of the second primary winding W2 wound on the second winding leg 212 are identical.

As mentioned above, in some embodiments, the second winding leg 212 includes the first air gap 217, and the first outer leg 213 and the second outer leg 214 have no air gaps. Alternatively, the second winding leg 212 includes the first air gap 217, and each of the first outer leg 213 and the second outer leg 214 includes the second air gap. And the second height of the second air gap is smaller than 1/10 of the first height of the first air gap. Thus, the equivalent magnetoresistance of the first winding leg 211 is greater than that of the first outer leg 213 and the second outer leg 214. Consequently, the AC magnetic flux generated by the second primary winding W2 (e.g., the AC magnetic flux indicated by the dotted line C) flows through the second winding leg 212 and then a greater portion of the AC magnetic flux flows through the first outer leg 213 and the second outer leg 214 to form a closed magnetic loop. Similarly, since the first winding leg 211 has the first air gap 217, the equivalent magnetoresistance of the second winding leg 212 is greater than that of the first outer leg 213 and the second outer leg 214. Consequently, the AC magnetic flux generated by the first primary winding W1 (e.g., the AC magnetic flux indicated by the dotted line B) flows through the first winding leg 211 and then a greater portion of the AC magnetic flux flows through the first outer leg 213 and the second outer leg 214 to form a closed magnetic loop. Both the AC magnetic flux generated by the first primary winding W1 wound on the first winding leg 211 and the AC magnetic flux generated by the second primary winding W2 wound on the second winding leg 212 flow through the first connection part 215 and the second connection part 216.

Moreover, each of the first connection part 215 and the second connection part 216 may be divided into three sections according to the various AC magnetic flux. Taking the first connection part 215 as an example, the first section of the first connection part 215 is approximately arranged between the first outer leg 213 and the first winding leg 211, the second section of the first connection part 215 is approximately arranged between the first winding leg 211 and the second winding leg 212, and the third section of the first connection part 215 is approximately arranged between the second winding leg 212 and the second outer leg 214.

Please refer to FIG. 3 again. In the second section of the first connection part 215, the AC magnetic flux generated by the first primary winding W1 and the AC magnetic flux generated by the second primary winding W2 are superimposed. In the first section and the third section of the first connection part 215, the AC magnetic flux generated by the first primary winding W1 and the AC magnetic flux generated by the second primary winding W2 are cancelled out each other. The relationships between the three sections of the second connection part 216 and the AC magnetic fluxes are similar to those for the first connection part 215, and not redundantly described herein. In this context, the cancellation of the magnetic fluxes indicates that the resultant magnetic flux is reduced to less than 20% of one of the two magnetic fluxes. The cancellation of the magnetic fluxes in the subsequent description also follows this rule.

As mentioned above, comparing with the AC magnetic flux in the connection part between two winding legs of U-shaped magnetic core, the resultant AC magnetic flux in the first section and the third section of the first connection part 215 and the resultant AC magnetic flux in the first section and the third section of the second connection part 216 are reduced. The vertical cross-section area of the first connection part 215 (or the second connection part 216) perpendicular to the length direction is reduced. Consequently, the volumes of the first section and the third section of the first connection part 215 and the volumes of the first section and the third section of the second connection part 216 can be reduced. For example, the widths WD1 of the first connection part 215 and the second connection part 216 can be reduced, the heights H of the first connection part 215 and the second connection part 216 can be reduced, or the widths WD1 and the heights H of the first connection part 215 and the second connection part 216 can be reduced. Since the size (e.g., thickness) of the magnetic element 20 is reduced, the size (e.g., thickness) of the power module 21 is correspondingly reduced.

In an embodiment, the vertical cross-section area of the first connection part 215 and the vertical cross-section area of the second connection part 216 are reduced. Preferably but not exclusively, the vertical cross-section area of the first connection part 215 and the vertical cross-section area of the second connection part 216 in parallel with the width direction (i.e., perpendicular to the length direction) is smaller than or equal to 75% of any one of the horizontal cross-section area of the first winding leg 211 and the horizontal cross-section area of the second winding leg 212 perpendicular to the height direction, respectively. As mentioned above, at the positions corresponding to the first outer leg 213 and the second outer leg 214, the AC magnetic flux generated by the first primary winding W1 and the AC magnetic flux generated by the second primary winding W2 are cancelled out each other. Consequently, the horizontal cross-section area of the first outer leg 213 and the horizontal cross-section area of the second outer leg 214 perpendicular to the height direction may be smaller than or equal to 75% of the horizontal cross-section area of the first winding leg 211 and may be smaller than or equal to 75% of the horizontal cross-section area of the second winding leg 212 perpendicular to the height direction, respectively.

Please refer to FIG. 4. In order to describe the winding methods of the first group of secondary windings (W3, W4) and the second group of secondary windings (W5, W6), the first primary winding W1 and the second primary winding W2 are not shown in FIG. 4. The first secondary winding W3 and the second secondary winding W4 of the first group of the secondary windings are wound on the first winding leg 211. The third secondary winding W5 and the fourth secondary winding W6 of the second group of the secondary windings are wound on the second winding leg 212. One terminal of the first secondary winding W3 and one terminal of the second secondary winding W4 are connected with a first node A. One terminal of the third secondary winding W5 and one terminal of the fourth secondary winding W6 are connected with a second node A'. The winding direction of the first group of the secondary windings wound on the first winding leg 211 and the winding direction of the second group of the secondary windings wound on the second winding leg 212 are opposite. As shown in FIG. 4, the first secondary winding W3 and the second secondary winding W4 of the first group of the secondary windings are wound on the first winding leg 211 in a counterclockwise direction, and the third secondary winding W5 and the fourth secondary winding W6 of the second group of the secondary windings are wound on the second winding leg 212 in a clockwise direction. Consequently, the AC magnetic flux generated by the secondary windings W3 and W4 wound on the first winding leg 211 and the AC magnetic flux generated by the secondary windings W5 and W6 on the second winding leg 212 are opposite. The principles associated with the superimposition and cancellation of the AC magnetic fluxes generated by the secondary windings are similar to those for the primary windings. Consequently, the sizes of the magnetic element 20 and the power module 21 can be reduced, and the power density of the power module 21 can be enhanced.

Similarly, the winding directions of the first group of secondary windings (W3, W4) wound on the first winding leg 211 and the second group of secondary windings (W5, W6) wound on the second winding leg 212 are not restricted as long as the AC magnetic flux generated by the secondary windings W3 and W4 and the AC magnetic flux generated by the secondary windings W5 and W6 are opposite. For example, in case that the phase difference between the voltage across two terminals of the first group of secondary windings (W3, W4) and the voltage across two terminals of the second group of secondary windings (W5, W6) is 180 degrees, the winding directions of the first group of secondary windings (W3, W4) and the second group of secondary windings (W5, W6) may be identical.

Please refer to FIG. 2 again. The first secondary winding W3 and the second secondary winding W4 are serially connected with the first node A. The third secondary winding W5 and the fourth secondary winding W6 are serially connected with the second node A'. The first node A and the second node A' are electrically coupled with each other through a trace on a printed circuit board of the power module 21. In an exemplary embodiment, as shown in FIG. 4, the first secondary winding W3, the second secondary winding W4, the third secondary winding W5 and the fourth secondary winding W6 may be configured to have one turn. It is noted that the turn numbers of these secondary windings are not restricted.

In the above embodiment, the magnetic element is a transformer. It is noted that the example of the magnetic element is not restricted. For example, in some other embodiments, the magnetic element may be two inductors or an integrated structure including a transformer and an inductor. In case that the magnetic element includes two inductors in series and the two inductors are defined by the magnetic core 200, the first primary winding W1 and the second primary winding W2. And the method of winding the first primary winding W1 and the second primary winding W2 is similar to that shown in FIG. 3. The first primary winding W1 is used as the winding of one inductor. The second primary winding W2 is used as the winding of the other inductor. Under this circumstance, the voltage across the two terminals of the first primary winding W1 and the voltage across the two terminals of the second primary winding W2 are DC voltage signals. Since the winding direction of the first primary winding W1 wound on the first winding leg 211 and the winding direction of the second primary winding W2 wound on the second winding leg 212 are opposite, the DC magnetic flux flowing through the first winding leg 211 and the DC magnetic flux flowing through the second winding leg 212 are opposite.

As mentioned above, in some embodiments, each of the first winding leg 211 and the second winding leg 212 includes the first air gap 217. That is, the equivalent magnetoresistance of the first winding leg 211 and the second winding leg 212 is greater than that of the first outer leg 213 and the second outer leg 214, respectively. Consequently, the DC magnetic flux generated by the first primary winding W1 on the first winding leg 211 flows through the first winding leg 211 and then a greater portion of the DC magnetic flux flows through the first outer leg 213 and the second outer leg 214 to form a closed magnetic loop. Similarly, the DC magnetic flux generated by the second primary winding W2 on the second winding leg 212 flows through the second winding leg 212 and then a greater portion of the DC magnetic flux flows through the first outer leg 213 and the second outer leg 214 to form a closed magnetic loop. Therefore, the sizes of the magnetic element 20 and the power module 21 can be reduced, and the power density of the power module 21 can be enhanced.

In some embodiments, in case that the magnetic element 20 may be two inductors in parallel and the two inductors are defined by the magnetic core 200 of FIG. 1 and the secondary windings. And the method of winding the first group of the secondary windings and the second group of the secondary windings is similar to that shown in FIG. 4. In this situation, the first group of secondary windings includes single secondary winding, and the second group of secondary windings also includes single secondary winding. Namely, two secondary windings are feasible. One terminal of the first group of the secondary windings and one terminal of the second group of the secondary windings are electrically connected with each other through a trace of the printed circuit board of the power module 21. Consequently, the sizes of the magnetic element 20 and the power module 21 can be reduced, and the power density of the power module 21 can be enhanced.

Figure 5:
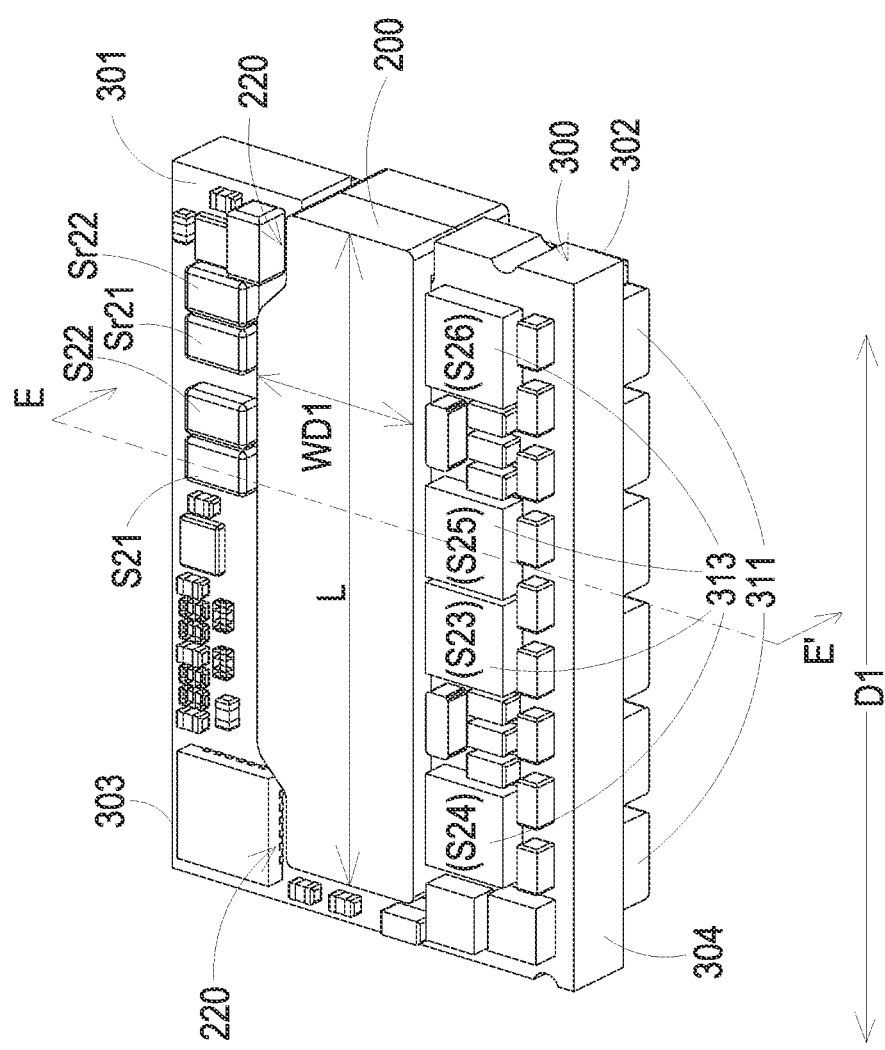
FIG. 5 is a schematic perspective view illustrating a three-dimension structure of a power module as shown in FIG. 2 according to an embodiment of the present disclosure.
Figure 6:
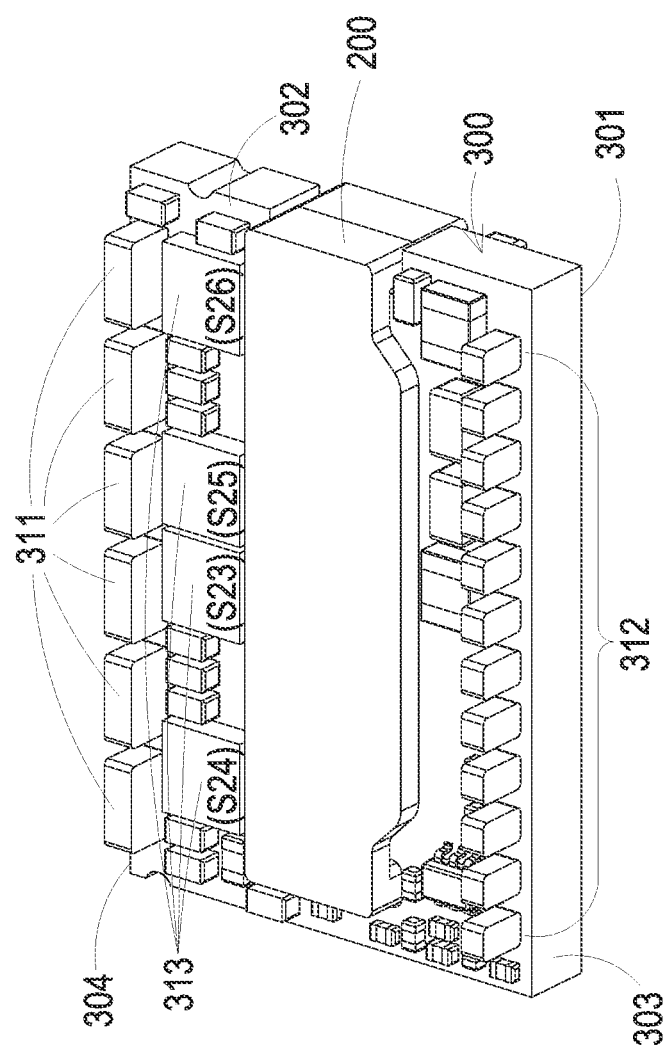
FIG. 6 is a schematic perspective view illustrating a three-dimension structure of the power module as shown in FIG. 5 and taken along another viewpoint according to an embodiment of the present disclosure.
Figure 7:
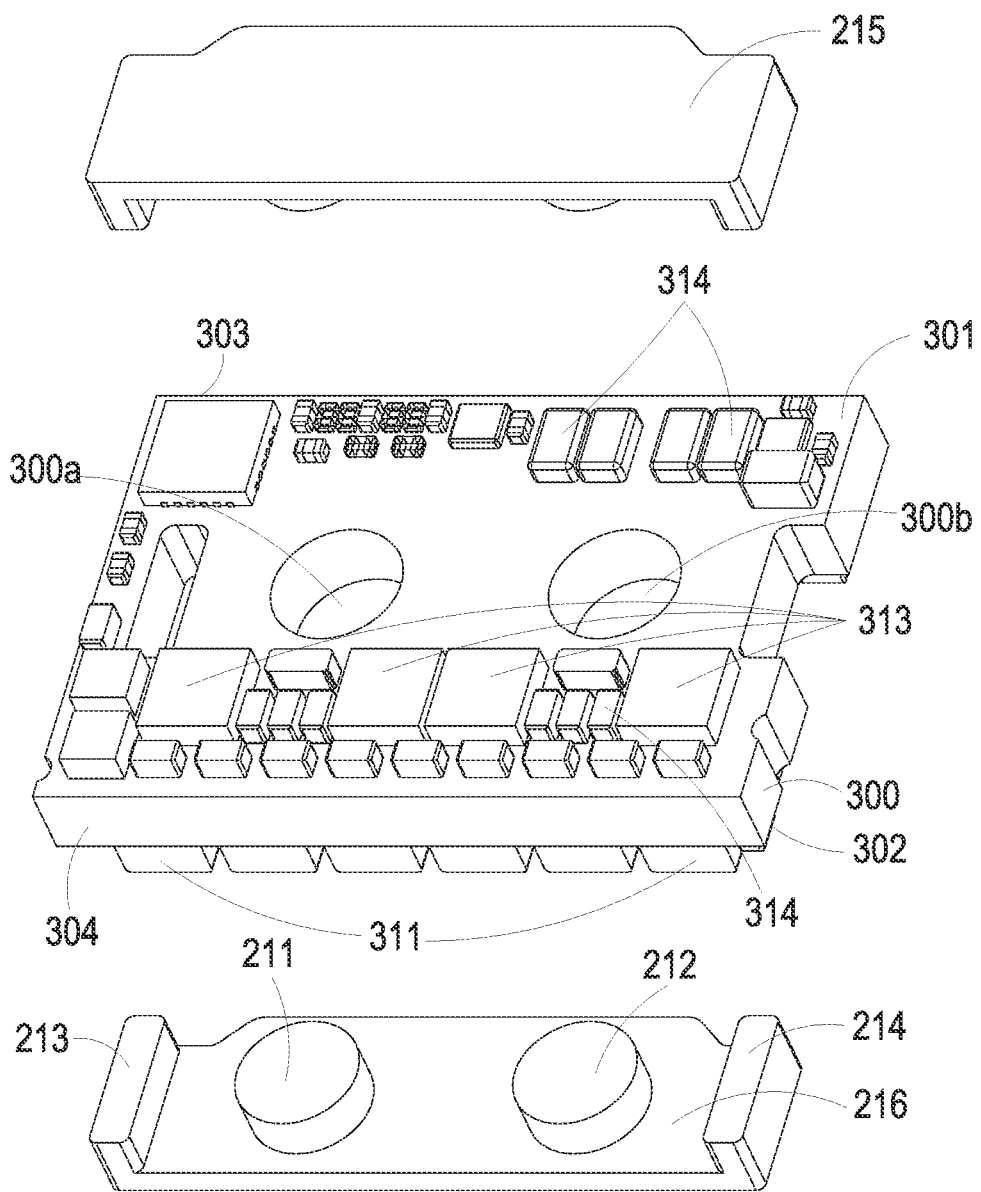
FIG. 7 is a schematic exploded view illustrating the power module as shown in FIG. 5.
Figure 8:
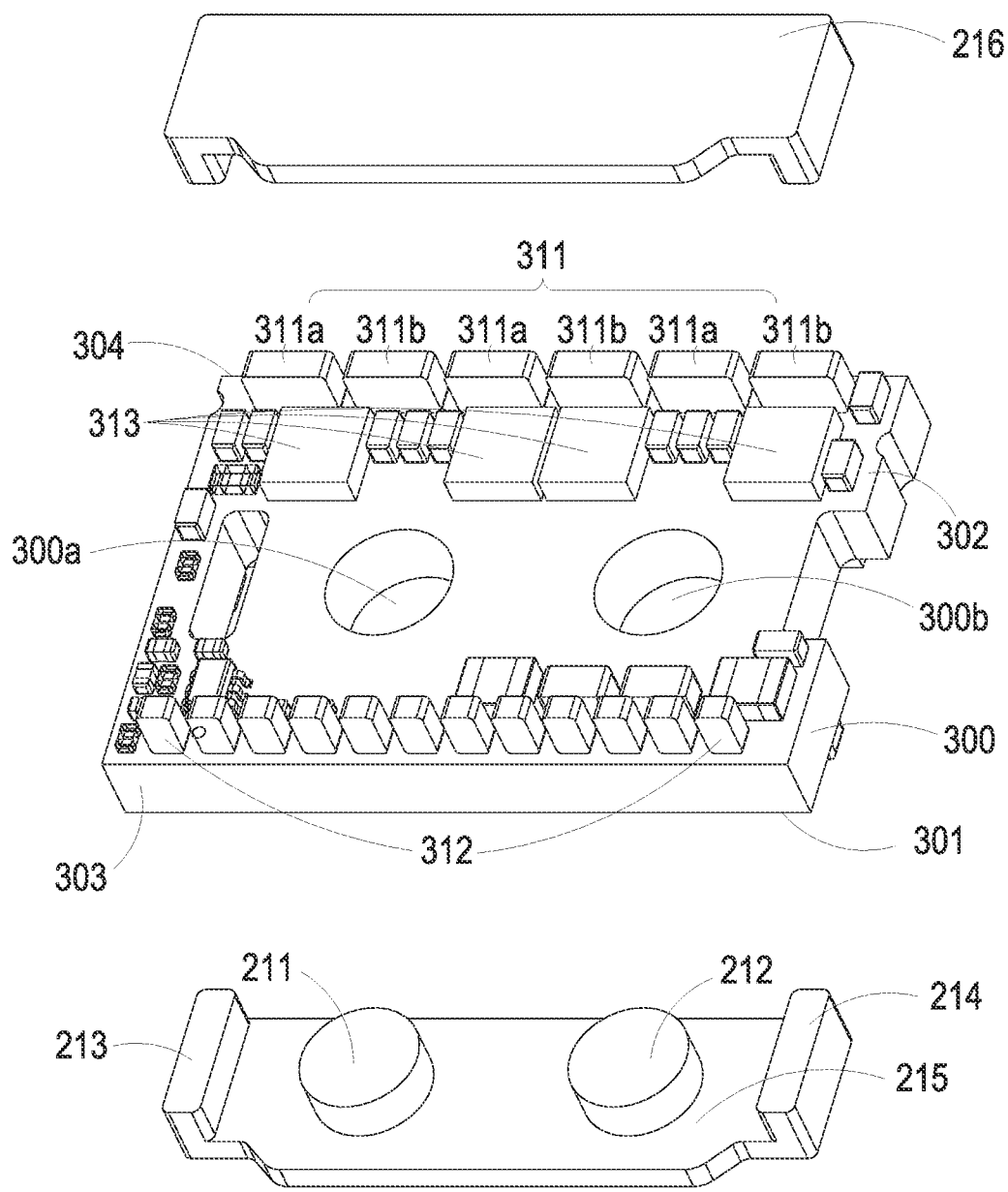
FIG. 8 is a schematic exploded view illustrating the power module as shown in FIG. 7 and taken along another viewpoint.

Hereinafter, a package structure of the power module 21 will be described with reference to FIG. 2 and FIGS. 5, 6, 7 and 8. FIG. 5 is a schematic perspective view illustrating a three-dimension structure of a power module as shown in FIG. 2 according to an embodiment of the present disclosure. FIG. 6 is a schematic perspective view illustrating three-dimension structure of the power module as shown in FIG. 5 and taken along another viewpoint according to an embodiment of the present disclosure. FIG. 7 is a schematic exploded view illustrating the power module as shown in FIG. 5. FIG. 8 is a schematic exploded view illustrating the power module as shown in FIG. 7 and taken along another viewpoint.

As mentioned above, the power module 21 includes the first end, the second end, the inductor Lin, the first capacitor C1, the primary side switching circuit 218, the transformer T, the secondary side switching circuit 219 and the second capacitor C2. Moreover, as shown in FIGS. 5 to 8, the power module 21 further includes a printed circuit board 300.

The transformer T has the magnetic element 20 as shown in FIGS. 3 and 4. Consequently, the sizes of the magnetic element 20 and the power module 21 are reduced, and the power density of the power module 21 is enhanced. As mentioned above, the magnetic core 200 of the magnetic element 20 includes the first winding leg 211, the second winding leg 212, the first outer leg 213, the second outer leg 214, the first connection part 215 and the second connection part 216. In the second section of the first connection part 215 and the second section of the second connection part 216, the AC magnetic flux generated by the first primary winding W1 and the AC magnetic flux generated by the second primary winding W2 are superimposed. In the first section and the third section of both the first connection part 215 and the second connection part 216, the AC magnetic flux generated by the first primary winding W1 and the AC magnetic flux generated by the second primary winding W2 are cancelled out each other. In an embodiment, the width of the first section and the third section of the first connection part 215 is smaller than the width of the second section of the first connection part 215, and the width of the first section and the third section of the second connection part 216 is smaller than the width of the second section of the second connection part 216. For example, as shown in FIGS. 5 to 8, the magnetic core 200 has two notches 220 at two corners. Some electronic components can be accommodated within the notches 200. Consequently, the size of the magnetic element 20 is reduced, and the volume of the power module 21 is reduced.

The printed circuit board 300 includes a first surface 301, a second surface 302, a first lateral wall 304 and a second lateral wall 303. The first surface 301 and the second surface 302 are opposed to each other. The first lateral wall 304 and the second lateral wall 305 are opposed to each other. In addition, the first lateral wall 304 and the second lateral wall 303 are arranged between the first surface 301 and the second surface 302. The magnetic element 20 is fixed on the printed circuit board 300. The first winding leg 211, the second winding leg 212, the first outer leg 213 and the second outer leg 214 of the magnetic core 200 are penetrated through the printed circuit board 300. In addition, the first winding leg 211, the second winding leg 212, the first outer leg 213 and the second outer leg 214 are partially accommodated within the printed circuit board 300. As mentioned above, the first outer leg 213, the first winding leg 211, the second winding leg 212 and the second outer leg 214 are sequentially arranged along the linear direction D1. The linear direction D1 is in parallel with the length direction of the magnetic core 200 and the length directions of the first lateral wall 304 and the second lateral wall 303. In FIG. 5, the long side of the first lateral wall 304 is also defined as the linear direction D1.

The four primary switching units S21, S22, Sr21 and Sr22 of the primary side switching circuit 218 are disposed on the first surface 301 of the printed circuit board 300 and located near the second lateral wall 303. Moreover, the four primary switching units S21, S22, Sr21 and Sr22 are arranged along the linear direction D1. The sequence of the four primary switching units S21, S22, Sr21 and Sr22 as shown in FIG. 5 is presented herein for illustration only. It is noted that the sequence of the four primary switching units S21, S22, Sr21 and Sr22 is not restricted.

The four secondary switching units S23, S24, S25 and S26 of the secondary side switching circuit 219 are disposed on the first surface 301 and the second surface 302 of the printed circuit board 300 and located near the first lateral wall 304. The four secondary switching units S23, S24, S25 and S26 are arranged along the linear direction D1. The sequence of the four secondary switching units S23, S24, S25 and S26 as shown in FIG. 5 is presented herein for illustration only. It is noted that the sequence of the four secondary switching units S23, S24, S25 and S26 is not restricted. Moreover, the transformer T is arranged between the four primary switching units S21, S22, Sr21 and Sr22 and the four secondary switching units S23, S24, S25 and S26.

In an embodiment, each of the first end and the second end of the power module 21 includes external terminals. The power module 21 is electrically connected with a system board (not shown) through the external terminals. As mentioned above, the power module 21 of the present disclosure can be applied to the large current circumstances. In accordance with the layout of the power module 21 of this embodiment, the second end is the large current side. In some other embodiments, the first end is the large current side, and the layout is correspondingly adjusted according to the designing concept of the present disclosure.

In accordance with a feature of the present disclosure, each of the four secondary switching units S23, S24, S25 and S26 of the secondary side switching circuit 219 includes even-numbered switches connected in parallel. In addition, the even-numbered switches of each secondary switching unit are evenly distributed on the first surface 301 and the second surface 302 of the printed circuit board 300. For example, in this embodiment, each of the four secondary switching units S23, S24, S25 and S26 includes two switches. In FIGS. 5 to 8, the switches of the secondary switching units S23, S24, S25 and S26 are indicated as switches 313. One switch 313 of each secondary switching unit is disposed on the first surface 301 of the printed circuit board 300 and located near the first lateral wall 304; and the other switch 313 of each secondary switching unit is disposed on the second surface 302 of the printed circuit board 300 and located near the first lateral wall 304. In addition, the two switches 313, disposed on the different surface, of each secondary switching unit are connected with each other in parallel through conductive holes (not shown) of the printed circuit board 300. Moreover, in each secondary switching unit, the projection area of the switches 313 on the first surface 301 of the printed circuit board 300 and the projection area of the switches 313 on the second surface 302 of the printed circuit board 300 are at least partially overlapped with each other.

For example, the secondary switching unit S23 is electrically connected with the first secondary winding W3. The current flowing through the first secondary winding W3 is divided into two portions, and a portion of the current flows through one switch 313 of the secondary switching unit S23 on the first surface 301 of the printed circuit board 300 and another portion of the current flows through one switch 313 of the secondary switching unit S23 on the second surface 302 of the printed circuit board 300. Consequently, the current flowing through the first secondary winding W3 can evenly flow through the two switches 313 of the secondary switching unit S23. In an embodiment, the first secondary winding W3 is a multi-layered planar PCB winding. The planar PCB winding is distributed in different layers of the printed circuit board 300. Consequently, the current can evenly flow through different layers of the printed circuit board 300. In this way, the equivalent DC impedance and the power loss of the planar PCB winding are reduced. Similarly, according to the layout of the secondary windings and the secondary switching units, the current flowing through the second secondary winding W4, the current flowing through the third secondary winding W5 and the current flowing through the fourth secondary winding W6 can evenly flow through different layers of the printed circuit board 300 and evenly flow through the two switches 313 of the corresponding secondary switching units. Since the power loss in the current path is reduced, the power conversion efficiency of the power module 21 is enhanced.

Please refer to FIGS. 7 and 8. In an embodiment, the switch 313 of the secondary switching unit S23 on the first surface 301 and the switch 313 of the secondary switching unit S23 on the second surface 302 of the printed circuit board 300 are electrically connected with one terminal of the first secondary winding W3. Consequently, the current flowing through the first secondary winding W3 can evenly flow through the first surface 301 and the second surface 302 of the printed circuit board 300. Similarly, the two switches 313 of the secondary switching unit S24 on the first surface 301 and the second surface 302 of the printed circuit board 300 are electrically connected with one terminal of the second secondary winding W4. Similarly, the two switches 313 of the secondary switching unit S25 on the first surface 301 and the second surface 302 of the printed circuit board 300 are electrically connected with one terminal of the third secondary winding W5. Similarly, the two switches 313 of the secondary switching unit S26 on the first surface 301 and the second surface 302 of the printed circuit board 300 are electrically connected with one terminal of the fourth secondary winding W6. As mentioned above, the secondary windings are wound on the two winding legs of the magnetic core 200, respectively. Moreover, the positions of the secondary switching units and the corresponding secondary windings are specially designed. Consequently, the current flowing through the first secondary winding W3, the current flowing through the second secondary winding W4, the current flowing through the third secondary winding W5 and the current flowing through the fourth secondary winding W6 can evenly flow through each layer of the printed circuit board 300.

Moreover, a first virtual line passes through the centers of any two switches 313 of the plurality of secondary switching units on the first surface 301 of the printed circuit board 300, and a second virtual line passes through the centers of the first winding leg 211 and the second winding leg 212 of the magnetic core 200. The angle between the first virtual line and the second virtual line is in the range between 0 and 45 degrees. For example, the angle between the first virtual line and the second virtual line is 0 degree. That is, the first virtual line and the second virtual line are in parallel with each other. Similarly, a third virtual line passes through the centers of any two switches 313 of the plurality of secondary switching units on the second surface 302 of the printed circuit board 300. The angle between the third virtual line and the second virtual line is in the range between 0 and 45 degrees. For example, the angle between the third virtual line and the second virtual line is 0 degree. That is, the third virtual line and the second virtual line are in parallel with each other.

Please refer to FIGS. 6 and 7. In the switches 313 of the plurality of secondary switching units on the first surface 301 or the second surface 302 of the printed circuit board 300, at least two of the switches 313 are arranged near each other. For example, in an embodiment, all switches 313 on the first surface 301 or the second surface 302 of the printed circuit board 300 are discretely arranged at a regular spacing interval. In another embodiment (e.g., as shown in FIG. 7), two switches 313 on the first surface 301 or the second surface 302 of the printed circuit board 300 are arranged near each other, but the other switches are discretely arranged at a regular spacing interval. The arrangement of the switches 313 is not restricted. That is, the arrangement of the switches 313 may be varied according to the practical requirements. Due to this structural design, the large current flows through different layers of the printed circuit board evenly, the power loss caused by the current path is reduced, and the power conversion efficiency of the power module 21 is enhanced.

Please refer to FIGS. 6 and 8. In an embodiment, each of the first end and the second end of the power module 21 includes at least two groups of external terminals, respectively. Each group of external terminals include at least one positive terminal pin and at least one negative terminal pin. Every two groups of external terminals include at least two positive terminal pins and at least one negative terminal pin. For example, the positive terminal pin of the external terminals at the second end of the power module 21 is used as the second positive terminal V2+, and the negative terminal pin of the external terminals at the second end of the power module 21 is used as the second negative terminal V2−. In an embodiment, every two groups of external terminals include two positive terminal pins and one shared negative terminal pin, and the shared negative terminal pin is arranged between the two positive terminal pins. In another embodiment, every two groups of external terminals include at least one positive terminal pin and at least two negative terminal pins. For example, every two groups of external terminals include two negative terminal pins and one shared positive terminal pin, and the shared positive terminal pin is arranged between the two negative terminal pins. In another embodiment, the at least two groups of external terminals include at least two positive terminal pins and at least two negative terminal pins. The at least two positive terminal pins and at least two negative terminal pins are alternately arranged. In addition, each group of external terminals include one positive terminal pin and one negative terminal pin.

The power module 21 further includes a plurality of first metal blocks 311. The plurality of first metal blocks 311 are discretely arranged on the second surface 302 of the printed circuit board 300 and located beside the first lateral wall 304. Moreover, the plurality of first metal blocks 311 are located beside the four secondary switching units S23, S24, S25 and S26 of the secondary side switching circuit 219; and the plurality of first metal blocks 311 are arranged between the first lateral wall 304 and the switches 313 of the secondary switching units S23, S24, S25 and S26. In other words, the secondary switching units S23, S24, S25 and S26 are arranged between the plurality of first metal blocks 311 and the transformer T (i.e., the magnetic element 20).

Please refer to FIG. 8 again. The plurality of first metal blocks 311 can be used as terminal pins. In the plurality of first metal blocks 311, at least one first metal block 311a is used as the second positive terminal V2+ of the power module 21, and at least one first metal block 311b is used as the second negative terminal V2− of the power module 21. One first metal block 311a and one corresponding first metal block 311b are collaboratively formed as one group of external terminals. As mentioned above, the second end of the power module 21 includes at least two groups of external terminals. In an embodiment as shown in FIGS. 6 and 8, the six pins at the second end of the power module 21 includes three groups of external terminals. The three groups of external terminals are arranged along the linear direction D1. In another embodiment as shown in FIGS. 6 and 8, the six pins at the second end of the power module 21 includes four groups of external terminals. Especially, three adjacent first metal blocks 311a, 311b and 311a are collaboratively formed as two groups of external terminals with two positive terminal pins and one shared negative terminal, and the other three adjacent first metal blocks 311b, 311a and 311b are collaboratively formed as two groups of external terminals with two negative terminal pins and one shared positive terminal. Certainly, the second end of the power module 21 is not limited to three group of external terminals as shown in FIG. 8, and an appropriate number of the first metal blocks 311 can also be selected to form multiple groups of external terminals.

Moreover, a first virtual line passes through the center of the first metal block 311a and the center of the first metal block 311b, and a second virtual line passes through the centers of the first winding leg 211 and the second winding leg 212 of the magnetic core 200. Preferably, the angle between the first virtual line and the second virtual line is in the range between 0 and 45 degrees. For example, the angle between the first virtual line and the second virtual line is 0 degree. That is, the first virtual line and the second virtual line are in parallel with each other. In another embodiment, the angle between the line passing through the centers of any two first metal blocks 311a or any two first metal blocks 311b and the line passing through the centers of the first winding leg 211 and the second winding leg 212 of the magnetic core 200 is in the range between 0 and 45 degrees. As shown in FIG. 8, the first metal blocks 311a and the first metal blocks 311b are alternately arranged along the linear direction. It is noted that the arrangement of the first metal blocks 311a and the first metal blocks 311b is not restricted.

The power module 21 further includes a plurality of second metal blocks 312. The plurality of second metal blocks 312 are discretely arranged on the second surface 302 of the printed circuit board 300 and located beside the second lateral wall 303. At least one of the second metal blocks 312 can be used as the first positive terminal of the power module 21. In some embodiments, some of the second metal blocks 312 can be used as signal terminals of the power module 2 in order to transfer signals.

Please refer to FIGS. 7 and 8. The printed circuit board 300 further includes a first opening 300a and a second opening 300b. The first opening 300a and the second opening 300b penetrate through the printed circuit board 300. When the magnetic element 20 is disposed on the printed circuit board 300, the first winding leg 211 is penetrated through the first opening 300a, and the second winding leg 212 is penetrated through the second opening 300b. The line passing through the centers of the first opening 300a and the second opening 300b is in parallel with the linear direction D1. The angle between the line passing through the centers of the first metal blocks 311a and 311b and the line passing through the centers of the first opening 300a and the second opening 300b is in the range between 0 and 45 degrees, e.g., 30 degrees. Moreover, the angle between the line passing through the centers of the at least two groups of external terminals and the line passing through the centers of the first opening 300a and the second opening 300b is in the range between 0 and 45 degrees. Due to this structural design, the distances between the windings wound on the first winding leg 211 and the second winding leg 212 and the external terminals (e.g., the first metal blocks 311a and 311b) are the shortest. Consequently, the equivalent DC impedance generated by the traces of the printed circuit board 300 and the power loss of the power module 21 are reduced. The first metal blocks 311 of the external terminals are arranged along the linear direction D1 and located beside the first lateral wall 304 of the printed circuit board 300. Moreover, the first metal blocks 311 of the external terminals correspond to the switches 313 of the secondary switching units. Consequently, the current can evenly flow through different layers of the printed circuit board 300, and the power conversion efficiency of the power module 21 is enhanced.

In some embodiments, the printed circuit board 300 further includes a third opening and a fourth opening. The third opening and the fourth opening penetrate through the printed circuit board 300. Alternatively, the third opening and the fourth opening are formed in edges of the printed circuit board. The first outer leg 213 is penetrated through the third opening. The second outer leg 214 is penetrated through the fourth opening.

Figure 9:
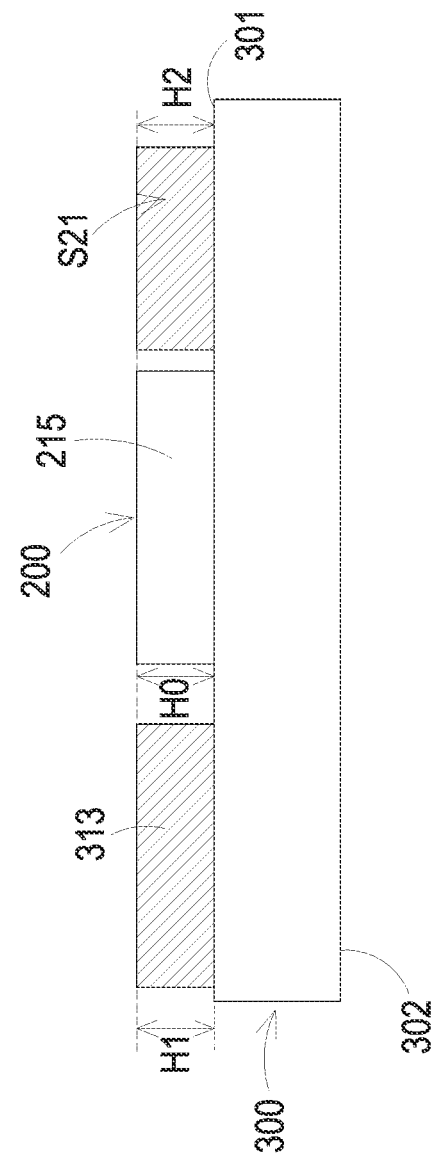
FIG. 9 is a schematic cross-sectional view illustrating the structure of the power module as shown in FIG. 5 and taken along the line E-E'.

FIG. 9 is a schematic cross-sectional view illustrating the structure of the power module as shown in FIG. 5 and taken along the line E-E'. As shown in FIG. 9, the distance between a top surface of the first connection part 215 of the magnetic element 20 and the first surface 301 of the printed circuit board 300 is H0. In an embodiment, the distance H0 is equal to the thickness H of the first connection part 215. Due to the assembling tolerance of the magnetic core, the distance H0 may be greater than the thickness H of the first connection part 215. For example, the distance between the top surface of the switch 313 of the secondary switching unit and the first surface 301 of the printed circuit board 300 is H1 (i.e., the height of the switch 313 is H1), and the distance between the top surface of the primary switching unit S21 (or S22, Sr21 or Sr22) and the first surface 301 of the printed circuit board 300 is H2 (i.e., the height of the switch of the secondary switching unit is H2). In an embodiment, the thickness H of the first connection part 215 (i.e., the distance H0) and the heights H1 and H2 are equal, i.e., H0=H1=H2. Consequently, the thickness and the size of the power module 21 are reduced. In another embodiment, the thickness H of the first connection part 215 (i.e., the distance H0) is 0.5~1.5 times the maximum value of the heights H1 and H2. For example, if H1>H2, the thickness H of the first connection part 215 (i.e., the distance H0) is 0.5~1.5 times the value of the height H1. The relationships between the second connection part 216 of the magnetic core 200 and the heights of corresponding switches are similar to the relationships between the distance H0, the height H1 and the height H2.

The relationships between the primary windings and the magnetic core 200 will be described with reference to FIG. 10. As mentioned above, the widths of the first connection part 215 and the second connection part 216 of the magnetic core 200 are reduced. Consequently, an overlapped region and a non-overlapped region are defined by the projection area of the magnetic core 200 and the projection area of the primary windings. The switches 313 of the secondary switching unit may be disposed within the non-overlapped region.

Figure 10:
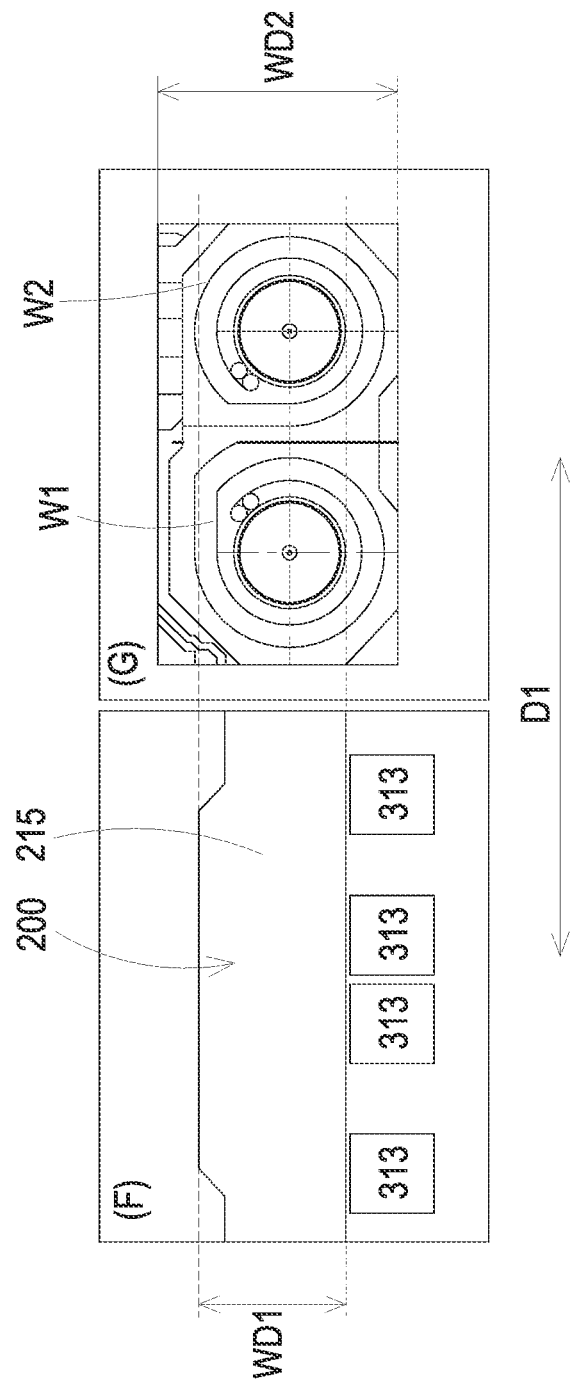
FIG. 10 schematically illustrates the top view of the power module as shown in FIG. 6 and the cross-sectional view of the magnetic element of the power module.

FIG. 10 schematically illustrates the top view of the power module as shown in FIG. 6 and the cross-sectional view of the magnetic element of the power module. In FIG. 10, the diagram F is the top view of the power module 21, and the diagram G is the cross-sectional view of the magnetic element 20. In the diagram F, the portions of the first primary winding W1 and the second primary winding W2 in a specified layer of the printed circuit board 300 are shown. The width of the magnetic core 200 is WD1. The width of the planar PCB winding of the first primary winding W1 is WD2. The width of the planar PCB winding of the second primary winding W2 is also WD2. The width WD1 is smaller than the width WD2. Consequently, the layout area of the magnetic element 20 in the first surface 301 or the second surface 302 of the printed circuit board 300 is reduced. In other words, some regions are retained to place more electronic components thereof. For example, the switches 313 of the secondary switching units may be arranged near the magnetic element 20. Moreover. at least a portion (e.g., 20%) of the projection area of the switch 313 with respect to the first surface 301 of the printed circuit board 300 is overlapped with the planar PCB winding of the corresponding primary winding (W1 or W2). Consequently, the size of the power module 21 is reduced, the current path of the large current is shortened and the equivalent DC impedance are also reduced, and the power conversion efficiency of the power module 21 is enhanced.

Please refer to FIGS. 5 and 6 again. In an embodiment, the power module 21 further includes at least one capacitor 314 (e.g., the first capacitor C1 and the second capacitor C2 as shown in FIG. 2). For example, the capacitor 314 is the second capacitor C2. The two terminals of the capacitor 314 are respectively connected with the positive terminal pin and the negative terminal pin of the at least one group of external terminals. The capacitor 314 is disposed on the first surface 301 and/or the second surface 302 of the printed circuit board 300. In an embodiment, the capacitor 314 is arranged between the two adjacent switches 313. The installation location of the capacitor 314 is not restricted. For example, in another embodiment, the capacitor 314 is arranged beside the switches 313. That is, the switches 313 are arranged between the magnetic element 20 and the at least one capacitor 314.

Moreover, the rest of the electronic components of the power module 21 as shown in FIG. 2 may be disposed on arbitrary locations of the printed circuit board 300 according to the practical requirements.

From the above descriptions, the present disclosure provides the power module. Each of the secondary switching units of the secondary side switching circuit of the power module includes even-numbered switches connected in parallel. In addition, the even-numbered switches of each secondary switching unit are evenly distributed on the first surface and the second surface of the printed circuit board. Consequently, the current flowing through each of the secondary windings electrically connected to the secondary switching unit can evenly flow through different layers of the printed circuit board and evenly flow through the two switches of the corresponding secondary switching units. Since the power loss in the current path is reduced, the power conversion efficiency of the power module is enhanced. Moreover, the magnetic element of the power module is specially designed. The magnetic core of the magnetic element includes two outer legs and two winding legs. The AC magnetic flux generated by the windings wound on one winding leg and the AC magnetic flux generated by the winding wound on the other winding leg are opposite. Consequently, the size of the power module is reduced, and the power density of the power module is enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power module, comprising:
    a printed circuit board having a first surface and a second surface;
    a magnetic element disposed on the printed circuit board, wherein the magnetic element comprises at least one primary winding and a plurality of secondary windings;
    a secondary side switching circuit comprising a plurality of secondary switching units, wherein each of the plurality of secondary switching units is electrically connected with the corresponding secondary winding of the plurality of secondary windings, and each secondary switching unit comprises a plurality of switches connected in parallel, wherein the plurality of switches are evenly distributed on the first surface and the second surface of the printed circuit board, and one part of the plurality of switches of each secondary switching unit are disposed on the first surface, and another part of the plurality of switches of each secondary switching unit are disposed on the second surface, and in each secondary switching unit, the projection of the switches on the first surface of the printed circuit board is at least partially overlapped with the projection of the switches on the second surface of the printed circuit board; and
    at least two groups of external terminals disposed on the second surface of the printed circuit board, and electrically connected with the plurality of secondary switching units, wherein the external terminals are located at one side of the secondary side switching circuit, and the secondary side switching circuit is arranged between the magnetic element and the external terminals.

2. The power module according to claim 1, wherein the magnetic element comprises a magnetic core, and the magnetic core comprises a first winding leg, a second winding leg, a first outer leg, a second outer leg, a first connection part and a second connection part,
    wherein the first outer leg, the first winding leg, the second winding leg and the second outer leg are sequentially arranged along a length direction of the magnetic core, and the first outer leg and the second outer leg are arranged between the first connection part and the second connection part, and the first outer leg and the second outer leg are located at two lateral sides of the first connection part and the second connection part respectively, and both the first winding leg and the second winding leg are arranged between the first outer leg and the second outer leg,
    wherein the at least one primary winding comprises a first primary winding and a second primary winding, and the plurality of secondary windings comprises a first secondary winding, a second secondary winding, a third secondary winding and a fourth secondary winding, wherein the first primary winding is wound on the first winding leg, the second primary winding is wound on the second winding leg, and the first secondary winding and the second secondary winding are also wound on the first winding leg, and the third secondary winding and the fourth secondary winding are also wound on the second winding leg.

3. The power module according to claim 2, wherein the external terminals comprise at least two first terminals having a first voltage level and at least one second terminal having a second voltage level,
    wherein a first virtual line is defined to pass a center of the first terminals and a center of the at least one second terminal, and a second virtual line is defined to pass a center of the first winding leg and a center of the second winding leg, and the angle between the first virtual line and the second virtual line is 0~45°.

4. The power module according to claim 2, wherein the external terminals comprise at least two first terminals having a first voltage level and at least one second terminal having a second voltage level,
    wherein a first virtual line is defined to pass respective centers of the at least two first terminals, and a second virtual line is defined to pass a center of the first winding leg and a center of the second winding leg, and the angle between the first virtual line and the second virtual line is 0~45°.

5. The power module according to claim 2, wherein a first virtual line is defined to pass respective centers of the at least two switches on the same surface of the printed circuit board, and a second virtual line is defined to pass a center of the first winding leg and a center of the second winding leg, and the angle between the first virtual line and the second virtual line is 0~45°.

6. The power module according to claim 2, further comprising a primary side switching circuit, wherein the primary side switching circuit is electrically connected with the first primary winding and the second primary winding, and the primary side switching circuit comprises at least one primary switching unit, and the primary switching unit is disposed on the first surface of the printed circuit board.

7. The power module according to claim 6, wherein a reference thickness is defined as the larger one of the thickness of the primary switching unit and the thickness of the secondary switching unit, and at least one of the first connection part and the second connection part has a thickness within a range of 50%~150% thickness of the reference thickness.

8. The power module according to claim 2, wherein a direction of an AC magnetic flux generated by the first primary winding wound on the first winding leg is opposite to a direction of an AC magnetic flux generated by the second primary winding wound on the second winding leg.

9. The power module according to claim 2, wherein the first primary winding and the second primary winding are planar PCB windings, wherein an overlapped region and a non-overlapped region are defined by a projection area of each switch with respect to the first surface of the printed circuit board and a projection area of the corresponding planar PCB winding of the first primary winding and the second primary winding.

10. The power module according to claim 9, wherein the at least one switch of the secondary switching unit is located within the non-overlapped region.

11. The power module according to claim 2, wherein the arrangement position of two switches of each secondary switching unit which are respectively disposed on the first surface and the second surface of the printed circuit board are corresponding to a terminal of the corresponding secondary winding electrically connected with the secondary switching unit.

12. The power module according to claim 3, wherein the first terminal and the second terminal of the at least two groups of external terminals are metal blocks.

13. The power module according to claim 4, wherein the first terminal and the second terminal of the at least two groups of external terminals are metal blocks.

14. A power module, comprising:
a printed circuit board having a first surface and a second surface;
a magnetic element disposed on the printed circuit board, wherein the magnetic element comprises at least two winding legs, at least two outer legs, a first connection part, a second connection part and at least two winding units, wherein the first connection part and the second connection part are connected with the at least two winding legs and the at least two outer legs, and the at least two winding legs are arranged between the at least two outer legs, wherein the at least two winding units are wound on the at least two winding legs respectively, and directions of AC magnetic fluxes generated by the corresponding windings wound on any two adjacent winding legs are opposite; and
a plurality of switching units disposed on the printed circuit board, and electrically connected with the at least two winding units,
wherein a reference thickness is defined as the largest one of the thickness of the plurality of switching unit, and at least one of the first connection part and the second connection part has a thickness within a range of 50%~150% thickness of the reference thickness.

15. The power module according to claim 14, wherein a vertical cross-section area of the first connection part or a vertical cross-section area of the second connection part in parallel with a width direction of the magnetic core is smaller than or equal to 75% of a horizontal cross-section area of the corresponding winding leg.

16. The power module according to claim 14, wherein a horizontal cross-section area of each outer leg is smaller than or equal to 75% of a horizontal cross-section area of each winding leg.

17. The power module according to claim 14, wherein the adjacent two winding legs comprise a first winding leg and a second winding leg, and the at least two winding units comprise a first winding and a second winding, wherein the first winding and the second winding are respectively wound on the first winding leg and the second winding leg along the same winding direction, and a terminal voltage of the first winding and a terminal voltage of the second winding have a phase difference with 180 degrees.

18. The power module according to claim 14, wherein the adjacent two winding legs comprise a first winding leg and a second winding leg, and the at least two winding units comprise a first winding and a second winding, wherein the first winding and the second winding are respectively wound on the first winding leg and the second winding leg along opposite winding directions, and a terminal voltage of the first winding and a terminal voltage of the second winding have the same phase.

19. The power module according to claim 14, wherein the at least two winding units are planar PCB windings.

* * * * *